(12) United States Patent
Stárek et al.

(10) Patent No.: US 12,725,757 B2
(45) Date of Patent: Sep. 1, 2026

(54) SUPPORT STRUCTURE OF INVERTED LAMELLA FOR TALL ROI

(71) Applicant: FEI Company, Hillsboro, OR (US)

(72) Inventors: Jaroslav Stárek, Křelov-Břuchotín (CZ); Jamie Dee Gravell, Beaverton, OR (US); Jaroslav Maniš, Brno (CZ); Tomáš Onderlička, Brno (CZ)

(73) Assignee: FEI COMPANY, Hillsboro, OR (US)

( * ) Notice: Subject to any disclaimer, the term of this patent is extended or adjusted under 35 U.S.C. 154(b) by 345 days.

(21) Appl. No.: 18/417,592

(22) Filed: Jan. 19, 2024

(65) Prior Publication Data

US 2024/0249910 A1 Jul. 25, 2024

Related U.S. Application Data

(60) Provisional application No. 63/480,673, filed on Jan. 19, 2023.

(51) Int. Cl.
*H01J 37/28* (2006.01)
*G01N 1/32* (2006.01)
*H01J 37/20* (2006.01)

(52) U.S. Cl.
CPC ................ *H01J 37/28* (2013.01); *G01N 1/32* (2013.01); *H01J 37/20* (2013.01); *H01J 2237/31749* (2013.01)

(58) Field of Classification Search
CPC .. H01J 37/28; H01J 37/20; H01J 2237/31749; H01J 37/3056; H01J 2237/31745; G01N 1/32; G01N 23/20008; G01N 23/04; G01N 23/20; G01N 23/20025; G01N 23/2202; G01N 23/2204; G01N 23/2251
See application file for complete search history.

(56) References Cited

U.S. PATENT DOCUMENTS 6,393,692 B1 * 5/2002 Ju ........................ G11B 5/3912 29/603.15
8,859,998 B2 † 10/2014 Blackwood
9,159,531 B2 * 10/2015 Nederlof ................ H01J 37/20
10,453,646 B2 † 10/2019 Alvis
2004/0184190 A1 * 9/2004 Han ..................... G11B 5/3163 360/125.46
2009/0116144 A1 * 5/2009 Lee ...................... G11B 5/3116 360/125.01
2009/0144966 A1 * 6/2009 Zheng ..................... G11B 5/112 29/603.18

(Continued)

FOREIGN PATENT DOCUMENTS

EP 1092515 A1 * 4/2001 ............. B26B 21/56
EP 3018693 A1 * 5/2016 .............. H01J 37/28
JP 2024544369 A * 11/2024 .............. H01J 49/06

*Primary Examiner* — David A Vanore
(74) *Attorney, Agent, or Firm* — Michael Best & Friedrich LLP

(57) ABSTRACT

Lamellae with thin regions for TEM of regions of interest include oppositely situated S-shaped cut faces that define a waist region. In some examples, the waist has a thickness of less than 25 nm and defines a double tapered region of height of between 400 nm and 800 nm that is suitable for TEM. A portion of the lamella at the top surface can comprising a metallic or other coating than serves to support the lamella.

19 Claims, 9 Drawing Sheets

(56) References Cited

U.S. PATENT DOCUMENTS

2011/0249360 A1* 10/2011 Nunokawa ........... G11B 5/1278
360/122
2015/0253353 A1* 9/2015 Alvis .................... H01J 37/285
428/389
2020/0313082 A1* 10/2020 Sonoda .................. H10B 61/00
2022/0020917 A1* 1/2022 Chang ..................... H01F 41/14
2023/0364688 A1* 11/2023 Stárek ..................... H01J 37/28
2024/0071720 A1* 2/2024 Gravell ............... H01J 37/3178
2024/0249910 A1* 7/2024 Stárek ...................... G01N 1/32
2025/0157781 A1* 5/2025 Gamm ................ H01J 37/1474

* cited by examiner
† cited by third party

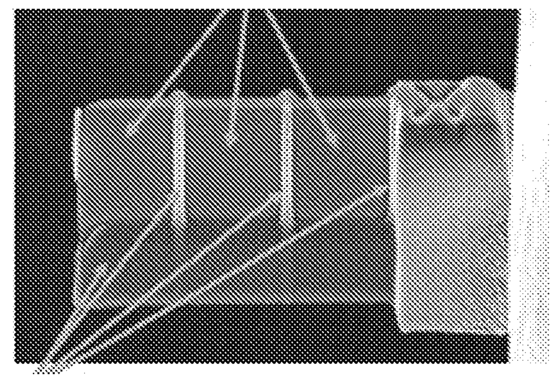
FIG. 1A
FIG. 1B
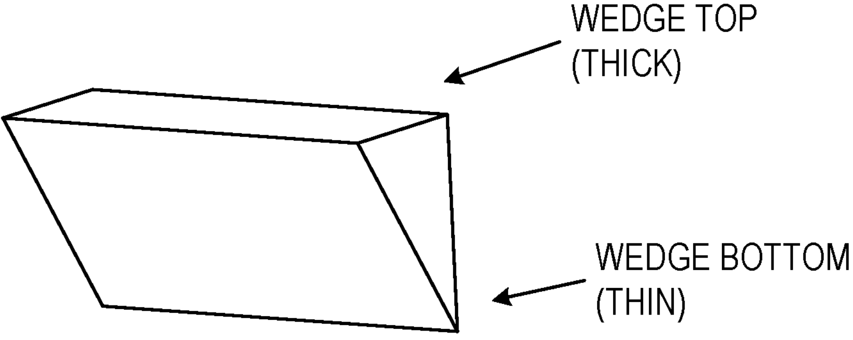

660
661
662
663
670
658
652
671
X
X
654
672
656
650

SUPPORT STRUCTURE OF INVERTED LAMELLA FOR TALL ROI

CROSS REFERENCE TO RELATED APPLICATIONS

This application claims priority to U.S. Provisional Application No. 63/480,673, filed Jan. 19, 2023, the entire contents of which is herein incorporated by reference.

FIELD

The disclosure pertains to the production of lamella for evaluation of semiconductor substrates.

BACKGROUND

Ultra-thin TEM lamella preparation methods are limited by the stability of the orientation and structure. Conventional methods for ultra-thin specimen preparation include a “top-down lamella with frames” method and an “inverted wedge lamella” method illustrated in FIGS. 1A-1B, respectively. In the top-down approach, parallel side walls are maintained on the upper portion of the lamella, and the lower portion and vertical struts are kept thicker to create a supporting frame. This keeps the thin part strained and prevents bending, a common problem in ultra-thin lamella. This approach does not allow repeatable sub-20 nm lamella preparation. Thinner lamella can be produced with the inverted wedge lamella method in which a focused ion beam (FIB) is directed to a specimen from two directions 101A, 101B as shown in FIG. 1C. With this method, a wedge 102 is formed that is thicker in at a surface 104 corresponding to a back surface of a specimen (e.g., bare silicon portion) and provides support for a thinner portion of the wedge 102 at a surface 106 corresponding to a front surface of the specimen. While this approach can achieve sub-20 nm thick lamellae, the height of the thinned area is limited by the wedge angle. In some cases, a 5-degree taper is the smallest achievable taper angle before lamella bending becomes problematic so thickness can vary considerably in the thinned area which includes the region of interest. Alternative approaches are needed.

SUMMARY

Methods of preparing lamellae comprise directing an ion beam to a back surface of a specimen at a first angle and at a first dose to form a first cut face having an S-shape and directing the ion beam to the back surface of the specimen at a second angle and at a second dose to form a second cut face having a second S-shape. The first dose and the second dose and the first angle and the second angle are selected to produce a lamella having a waist.

Charged particle beam systems operable to produce double-tapered lamellae comprise a focused ion beam (FIB) source and a substrate stage operable to secure a specimen and to orient the specimen with respect to the FIB to select an angle of incidence of the FIB to the specimen. A control system is coupled to the FIB source and the substrate stage to scan the FIB and a specimen surface with respect to each other to define tapered cut faces that extend from a front surface to a back surface of a specimen and define a waist proximate the front surface or elsewhere in the specimen. The double tapers can be obtained using FIB exposure from a single side of a specimen.

Lamellae comprise a specimen section defined by tapered cut faces that extend from a surface corresponding to a specimen back surface to a waist and from a specimen surface corresponding to a specimen front surface to the waist.

The foregoing and other objects, features, and advantages of the disclosed technology will become more apparent from the following detailed description, which proceeds with reference to the accompanying figures.

BRIEF DESCRIPTION OF THE DRAWINGS

FIG. 1A illustrates a lamella with a supporting frame.

FIG. 1B illustrates an inverted wedge lamella.

DETAILED DESCRIPTION

Introduction and Terminology

Figure 1C:
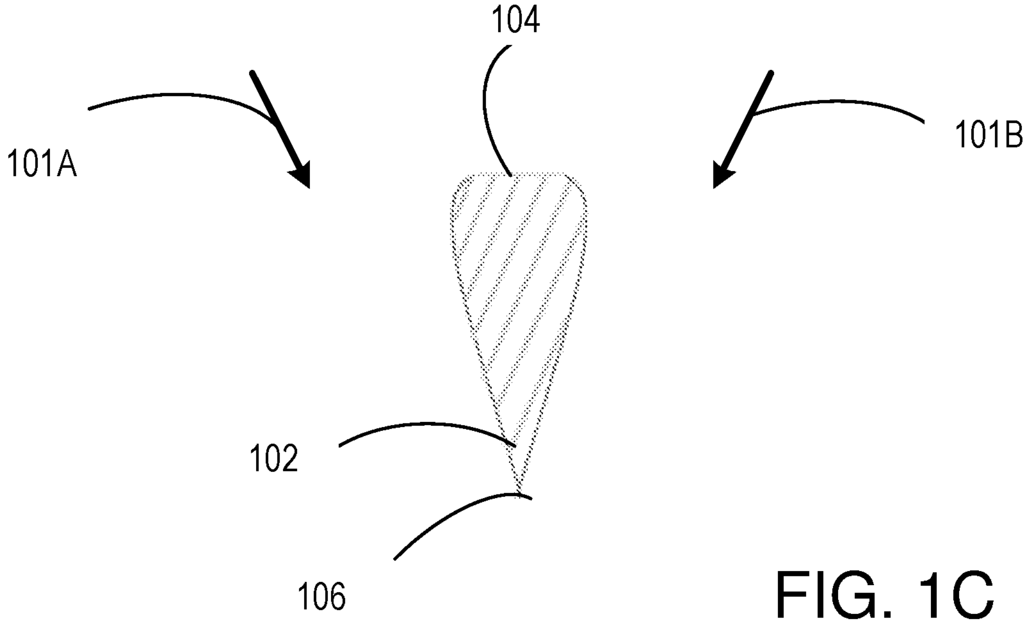
FIG. 1C illustrates fabrication of an inverted wedge lamella.

The disclosure pertains to methods and apparatus for making lamellae and lamella having a thinnest portion at or near a layer of interest in a specimen and an increasing thickness away from the thinnest portion. For convenience, lamellae are described with respect to orthogonal XYZ coordinate axes having a Z-axis perpendicular to specimen top or bottom surfaces and an X-axis that is parallel to a thinnest dimension. A thinnest portion of a lamella is referred to herein as a “waist” and waists are shown as being along the X-axis. Specimens of interest are generally relatively thin along the Z-axis and much larger along X- and Y-axes. Exterior surfaces of specimens parallel to an XY plane are referred to herein as “major surfaces.” Specimens are described with respect to thickness or thickness dimension along the Z-axis. Lamella are described with respect to a height or height dimension along the Z-axis, a width or width dimension along the X-axis, and a depth dimension along the Y-axis. Other coordinates can be used and these are for purposes of illustration. As used herein, parallel or perpendicular refers to alignments within ±1, 2, 5, or 10 degrees. A specimen front side is typically associated with electronic devices while a back side defines a thickness that provides mechanical support. In the drawings, the back side of a specimen is generally shown above the front side so that the back and front sides can be referred as top and bottom sides, respectively.

As discussed below, lamella can be tapered from a top surface and a bottom surface of a substrate to a waist, forming a vase shape as viewed in an XZ-plane. The waist is generally formed proximate a portion of a specimen which is of interest for investigation via TEM, in most cases within 100 nm, 200 nm, 300 nm, 400 nm, 500 nm, 600 nm, 700 nm, 800 nm, 900 nm, or 1 μm of such surface. However, the waist can be situated at or near a specimen surface or anywhere within the specimen. Lamellae can be defined by S-shaped cut faces that extend along a Z-axis from a top surface to a bottom surface of a substrate. In typical examples, S-shape curves on opposite sides of a lamella have the same shape but opposite curvatures and correspond to mirror images of each other. For convenience, such S-shapes are referred to herein as "opposite." Surfaces such as those defined by milling or other process to form tapered or double-tapered surfaces of a lamella are referred to herein as "cut faces." The associated tapers can correspond to S-curves or other shapes and are limited to linear tapers. "Double-tapered" refers to tapers from opposite surfaces of a specimen to a waist withing the specimen.

In the examples, a top surface of a substrate is generally a surface to which a FIB is directed to produce lamella and a bottom surface is a surface associated with thinner lamella portions. In typical practical examples, the top surface is a back side of a substrate in which or on which electronic devices are formed at a bottom surface opposite the top surface. Substrates are often provided with a protective or other coating that defines the bottom surface; devices formed at or near the bottom surface are typically of interest and for investigation via TEM, and a lamella containing electronic devices is preferable thin and relatively flat in the device-containing portion. Specimens of interest can be based on portions of semiconductor wafers, for example, a portion in which a wafer is thinned from the back side. Typically lamellae are more conveniently produced from specimens that are thinner than typical wafer thicknesses.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Example 1

Figures 2A, 2B, 2C:
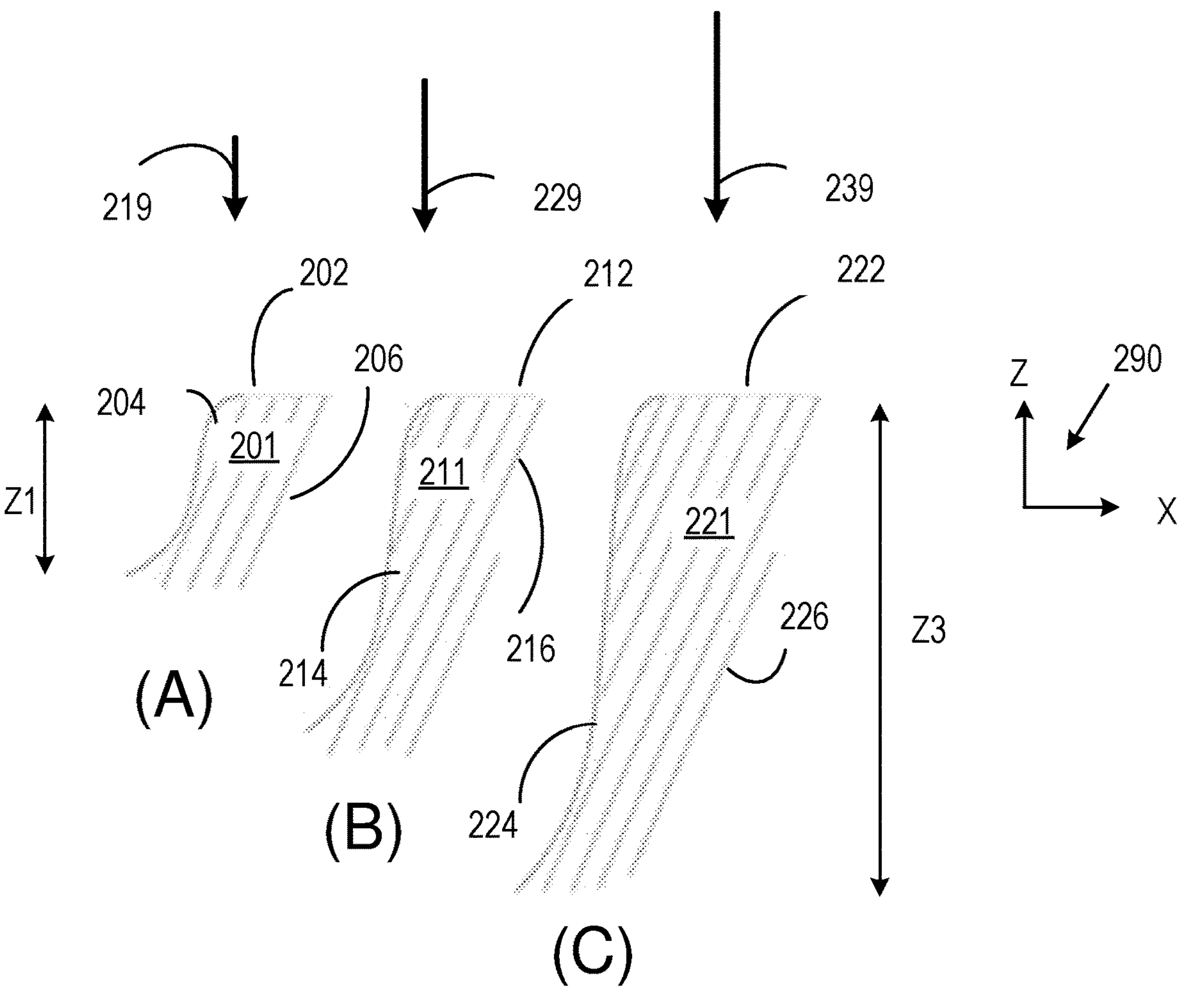
FIGS. 2A-2C illustrate lamella cut faces produced with focused ion beams (FIBs) for increasing FIB doses.

Ion beam milling (typically focused ion beam (FIB) milling) characteristically produces S-shaped cut profiles in specimens as shown in FIGS. 2A-2B. As shown, varying FIB dose permits varying cut face depth in a specimen. Referring to FIG. 2A, a FIB 219 having a first dose is directed to a top surface 202 of a substrate 201 to produce an S-shape cut face 204 that extends a distance Z1 into the specimen along a Z-axis defined by a coordinate system 290. The reference numeral 206 indicates an uncut, interior portion of the substrate 201. In FIG. 2B, a FIB 229 having a second dose, greater that the first dose, is directed to a top surface 212 of a specimen 211 to produce an S-shape cut face 214 that extends a distance greater than the distance Z1 into the specimen 211. As in FIG. 2A, a reference numeral 216 indicates an uncut, interior portion of the specimen 211. In FIG. 2C, a FIB 229 having a third dose, greater than the second dose, is directed to a top surface 222 of a specimen 221 to produce an S-shape cut face 224 that extends a distance Z3 into the specimen that is greater that the distances of FIGS. 2A-2B.

Example 2

Figure 3A:
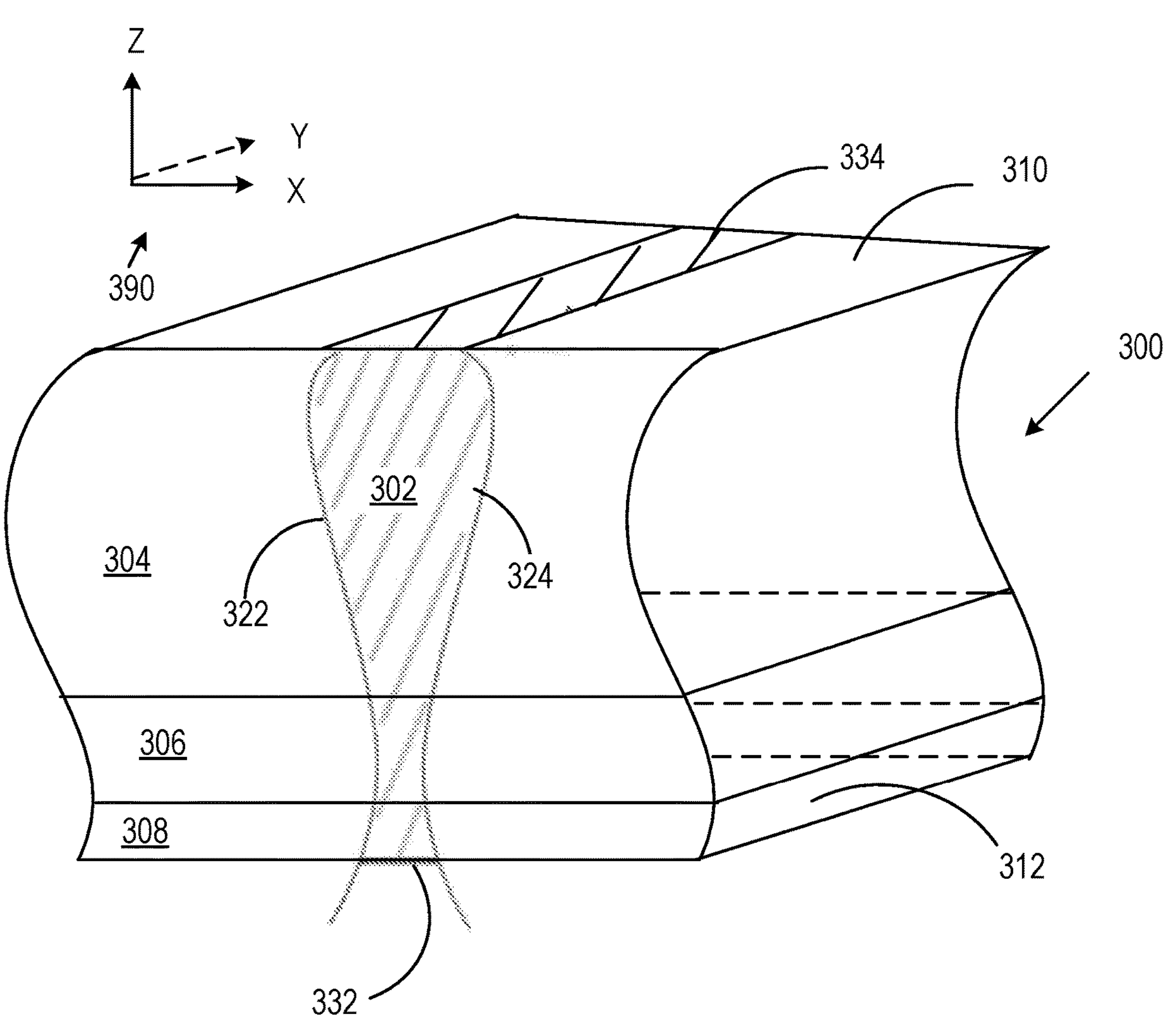
FIG. 3A illustrates a representative substrate from which a double-tapered lamella is to be produced with a FIB.
Figure 3B:
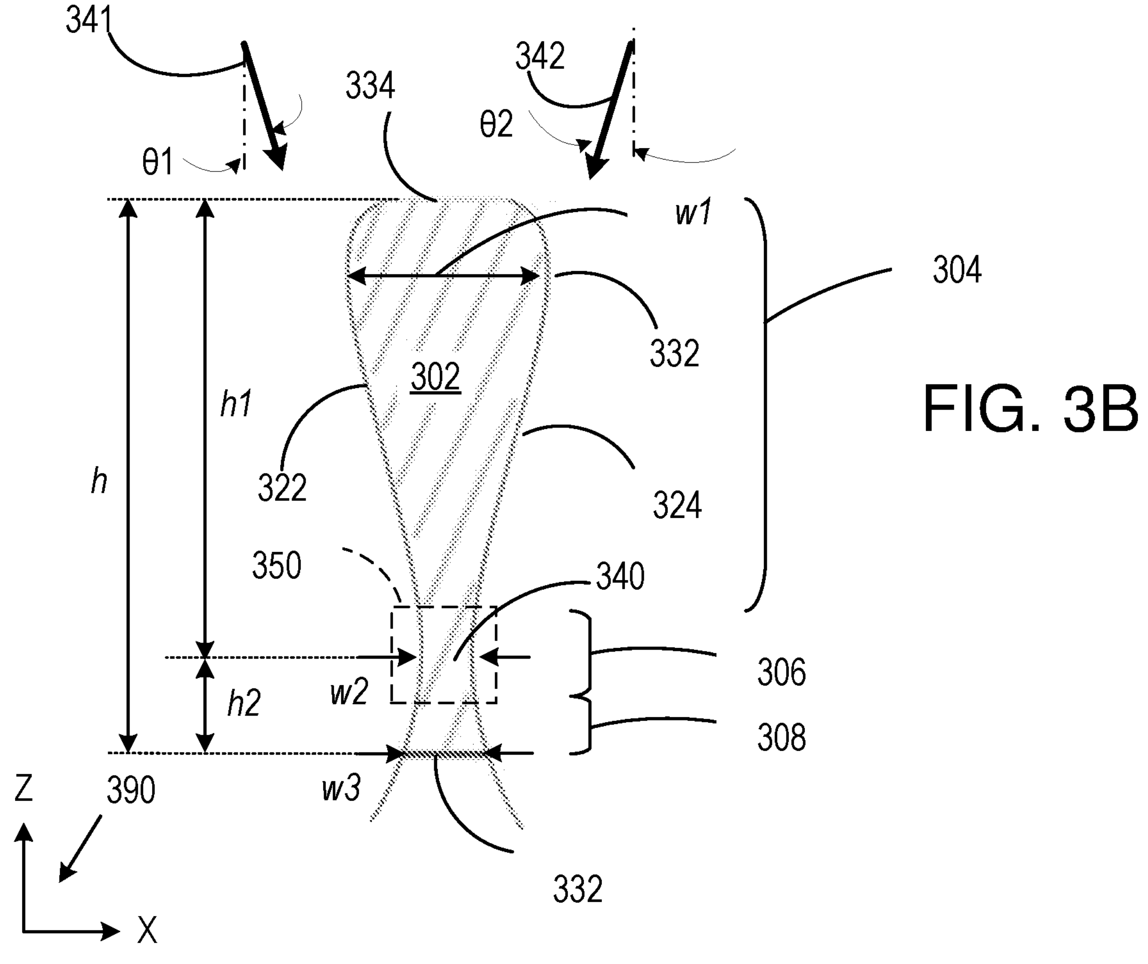
FIG. 3B illustrates the lamella milled from the substrate of FIG. 3A.

As shown in FIGS. 2A-2C, by varying FIB dose, different S-shaped cut faces can be produced. These cut-faces can be used to produce a vase-like lamella 302 as shown in FIGS. 3A-3B. FIG. 3A shown the lamella 302 as a portion of a specimen 300 from which the lamella 302 is to be milled. FIG. 3B illustrates the lamella 302 as produce by milling. As shown in FIG. 3A, the specimen 300 includes a substrate 304 such as a silicon layer or wafer, a device layer 306, and a protective layer 308. The device layer 306 typical defines one or more electronic devices and this portion of the specimen 300 is generally of interest for additional investigation such as by SEM or TEM imaging. The protective layer 308 can be a metallic or other layer such as a platinum layer and can protect the specimen 300 from damage during FIB exposure. The specimen 300 has a major surface 310 (a top surface) and a major surface 312 (a bottom surface). The lamella 302 is defined by S-shaped cut faces 322, 324, a bottom surface 332 (a portion of the bottom surface 312) and a top surface 334 (a portion of the top surface 310). The lamella 302 can extend parallel the Y-axis of a coordinate system 390 distances of 1, 2, 5, and 10 μm or other distance.

The lamella 302 is shown in further detail in FIG. 3B. Upper portions of the S-shaped cut faces 322, 324 define a maximum upper width w1 from which the lamella generally tapers toward a lamella waist 340 having a width w2. The lamella 302 terminates at the bottom surface 332 at a width w3. The lamella 302 has a top-to-bottom height h, a height from the lamella waist 340 to the top surface 332 of h1 and a height from the lamella waist 340 to the bottom surface 332 of h2. Approximate locations of the device layer 306 and the protective layer 308 are shown. Typically, the waist 340 is situated in the device layer 306 and provides a thinned, relatively flat specimen portion for use in investigation of devices formed in the device layer 306. Waist widths of 15, 20, 25, 30, 50, 100, 150 nm can be produced and the portion of the protective layer 308 in the lamella 302 can provide mechanical support. A region of interest 350 to be use for evaluation typically includes the waist 340 and does not have excessive thickness variations although tapered, with taper angles less than 5, 4, 3, 2, or 1 degree.

FIG. 3B also illustrate FIB orientations 341, 342 used to produce the cut faces 322, 324. The FIB is incident at angles θ1, θ2 with respect to the Z-axis the FIB and the substrate 300 are scanned with respect to each other along the X-axis. Selecting beam dose, scan rate, and angles θ1, θ2, the S-shapes of the cut faces can be configured to produce a suitable waist dimension. Typically, the angles θ1, θ2 are equal and opposite so that the S-shaped cut faces 322, 324 are opposite shapes. This can tend to reduce warping or bending of the lamella 302.

The lamella 302 has shape defined by S-shaped cut faces 322, 324. More generally, suitable lamellae have a double-tapered shape that tapers from a bottom surface to a waist and from a top surface to the waist. The waist (thinnest portion) is generally situated at a region of interest in a sample.

Example 3. Representative Lamella

Figures 4A, 4B:
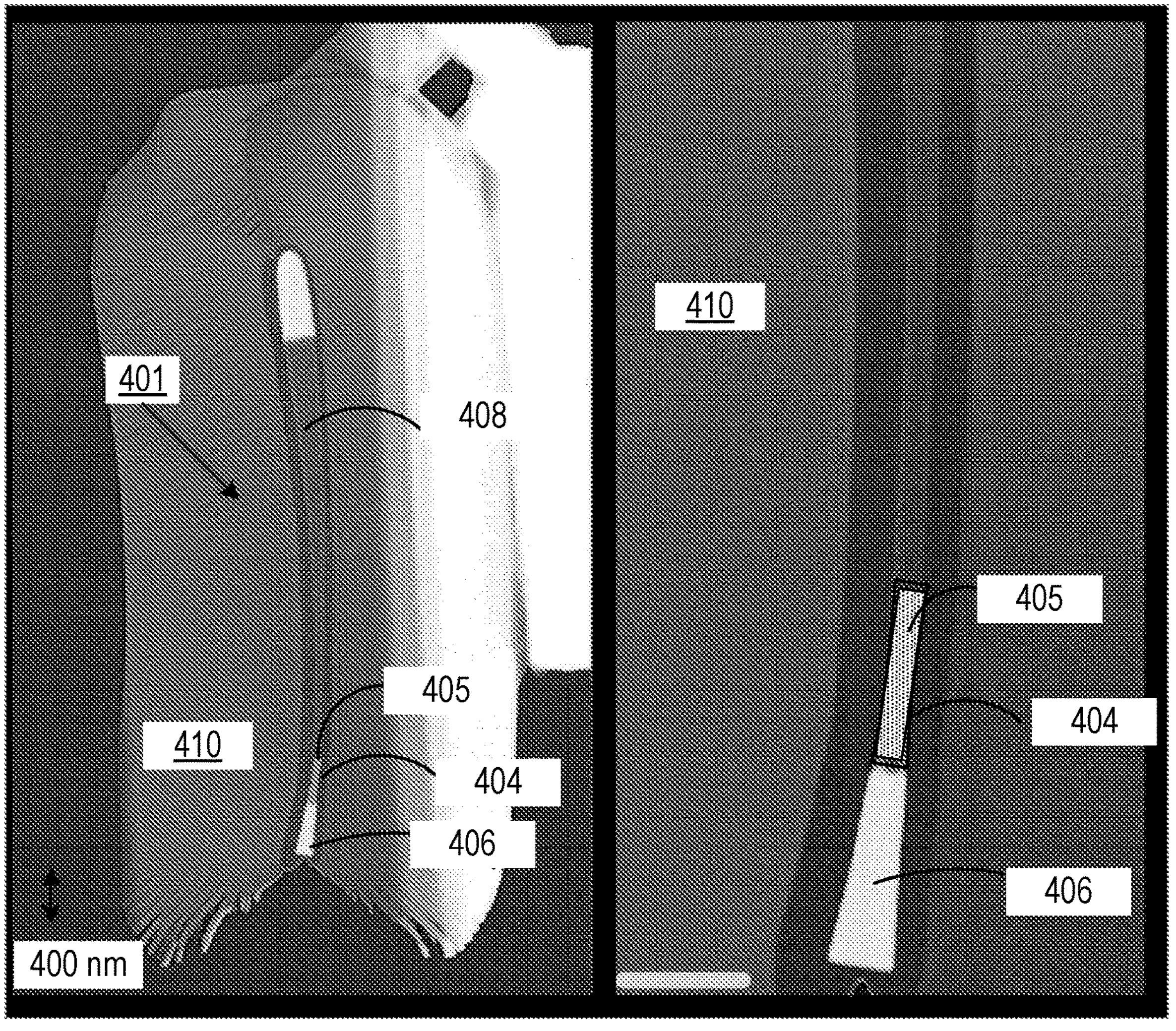
FIG. 4A is a TEM image of a representative double-tapered lamella embedded in a protection material.
FIG. 4B is an enlarged view of a portion of FIG. 4A.

FIGS. 4A-4B illustrate a lamella 401 as described above having a waist region 404 (typically including a device layer) that includes features interest in a region 405, a portion 406 corresponding to a protective layer, and a portion 408 corresponding to a substrate. As shown, the lamella 401 is surrounding by a support material 410. An approximate scale is provided for FIG. 4A. Lamella having waist thickness of less that 50, 40, 30, 20, 15, and 10 nm can be produced and having total heights of 1, 2, 5, 7.5, 10, 20 μm or more while remaining sufficiently flat for TEM imaging. Lamella depth can be 1, 2, 5, 7.5, 10, 20 μm or more.

Example 4. Representative Dual Beam System

Figure 5:
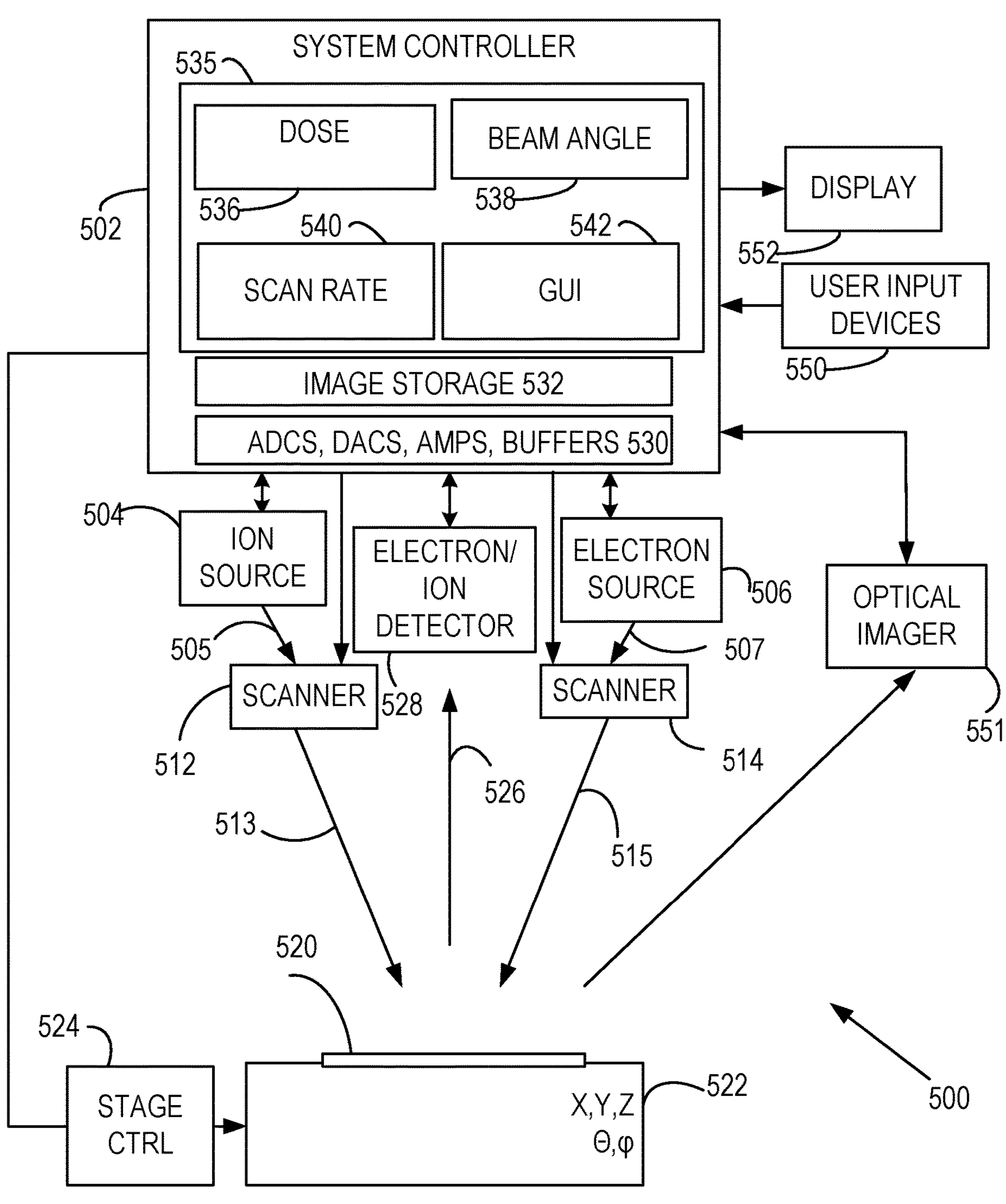
FIG. 5 illustrates a representative dual beam imaging and FIB milling apparatus that can be used to produce double-tapered lamella.

Referring to FIG. 5, a dual beam (FIB and e-beam) system 500 that can produce and image a lamella includes a system controller 502 that is coupled to an ion beam source 504, an electron beam source 506 that produce an ion beam 505 and an electron beam 507, respectively. Respective scanners 512, 514 are situated to direct a scanned ion beam 513 and a scanned electron beam 515, respectively, with respect to a specimen 520. In some applications, images are obtained based on the scanned electron beam 515, and the scanned ion beam 513 is used only for specimen modification such as FIB milling. However, images can be obtained with either one or both of the scanned ion beam 513 and the scanned electron beam 515. In some cases, an imaging system includes only one of an electron beam source and an ion beam source.

The specimen 520 is secured to a stage 522 that is coupled to a stage controller 524 that is in turn coupled to the system controller 502. The stage 522 generally can provide one or more translations, rotations, or tilts as directed by the system controller 502. A beam 526 responsive to the scanned ion beam 513 or the scanned electron beam 515 is directed to an electron or ion detector 528 which is coupled to system electronics 530 which can include one or more analog-to-digital convertors (ADCs), digital to analog-convertors (DACs), amplifiers, and buffers for control of the detector 528 and processing (amplification, digitization, buffering) of signals associated with the detector 528. In other examples, a photon detector is used that produces an electrical signal that is further processed by the system electronics. In most practical examples, at least one ADC is used to produce a digitized detector signal that can be stored in one or more tangible computer readable media (shown as image storage 552) as an image. In other examples, image storage is remote via a communication connection such as a wired or wireless network connection. The beam 526 can be scattered portions of the scanned ion beam 513, the scanned electron beam 515, secondary electrons, ions, or neutral atoms.

The system controller 502 is coupled to a memory 535 that stores processor-executable instructions for lamella milling such as required FIB doses at 536, scan rates at 540, beam angle selection at 538, and to provide a GUI 542 for various other operations such as stage and substrate positioning. The system controller 502 establishes lamella milling parameters and is in communication with the stage controller 524 to orient the substrate with respect to the FIB. Typically FIB incidence angle and FIB scanning are controlled with substrate rotation and translation by the stage 522. Specimen images stored at 532 can be presented on a display 552, and system control and imaging parameters can be specified using internally stored values from the memory 535 or provided by a user with one or more user input devices 550.

It will be appreciated that the layout of FIG. 5 is for convenient illustration, and actual alignments of various beam sources and other systems and components are not shown.

Example 5. Representative FIB Milling Method

Figures 6A, 6B:
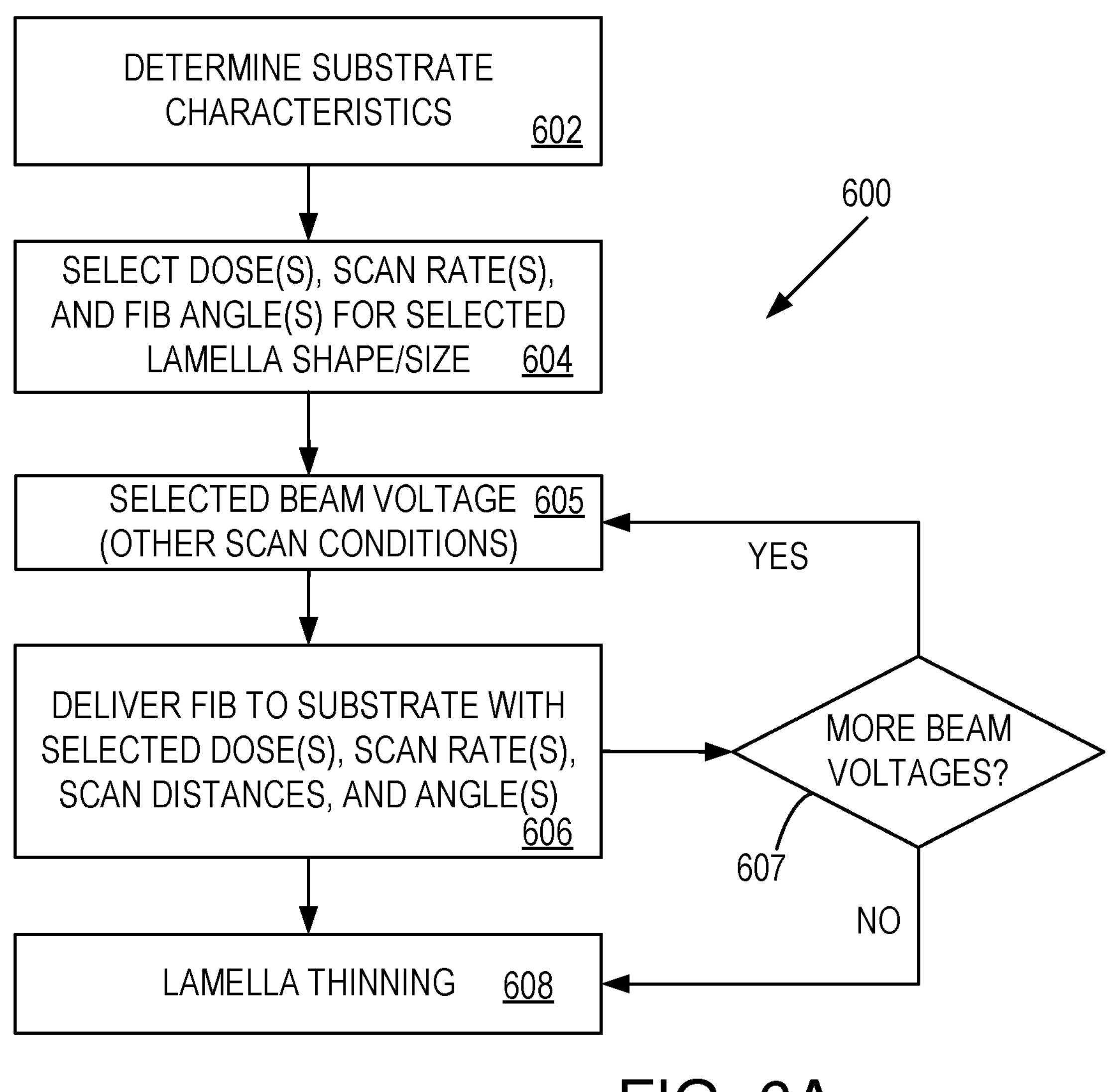
FIG. 6A illustrates a representative method of milling double-tapered lamella.
FIG. 6B illustrates milling of a representative double-tapered lamella.

Referring to FIG. 6A, a representative method 600 of milling a specimen to produce a double-tapered lamella includes determining specimen characteristics associated with milling and a location of region of interest at 602. In some cases, some preliminary FIB milling on a similar specimen is used. At 604, FIB and scanning conditions such as FIB dose, scan rate, FIB angles of incidence, and FIB focus are selected to produce a lamella of a selected shape with a waist suitably located. Beam voltage is selected at 605 and at 606, the FIB is delivered to the specimen at the selected doses, scan rates, scan distances, FIB angles of incidence, and beam voltage. Upon completion of this exposure, it is determined if scans at additional beam voltages or other conditions are to be performed at 607. If so, the method returns to 650. Otherwise, the above shaping steps, the lamella can be thinned to final thickness at 608, typically with additional FIB exposures.

Fabrication of a double-tapered lamella is illustrated with a specimen 650 illustrated in FIG. 6B. The specimen 650 includes a base substrate 652, a layer of interest (a device layer) 654, and a protective layer 656. A lamella to be milled is illustrated as an outline area 658 and includes an upper taper 670 and a lower taper 672 that produce a waist 671 in the layer of interest 654. A FIB shown at 660, 662 and oriented to produce sequential exposures at opposite angles is scanned toward a specimen portion that is to become the lamella as shown by arrows 660, 661. Selection of scan distances can be used to establish lamella thickness, and in some cases, the same or different scan distances are used on both sides of the specimen. Equal or different dose, equal or different scan angles, equal or different scan rates can be used, but symmetric lamellae are generally preferred. In some cases, the FIB is scanned at two more beam voltages, wherein beam voltage is a measure of beam energy at the specimen. In many cases, it is convenient use a higher FIB energy (such as 20, 25, 30, 35, or 40 keV) for an initial, more rapid milling, followed by milling at a lower beam energy (such as 0.5, 1, 2, 3, 4, or 5 keV) to produce a final cut face shape or to remove ion-induced damage produced by previous FIB exposures, typically exposures at higher beam energies.

Example 6. Representative Computing Environment for Milling Control

Figure 7:
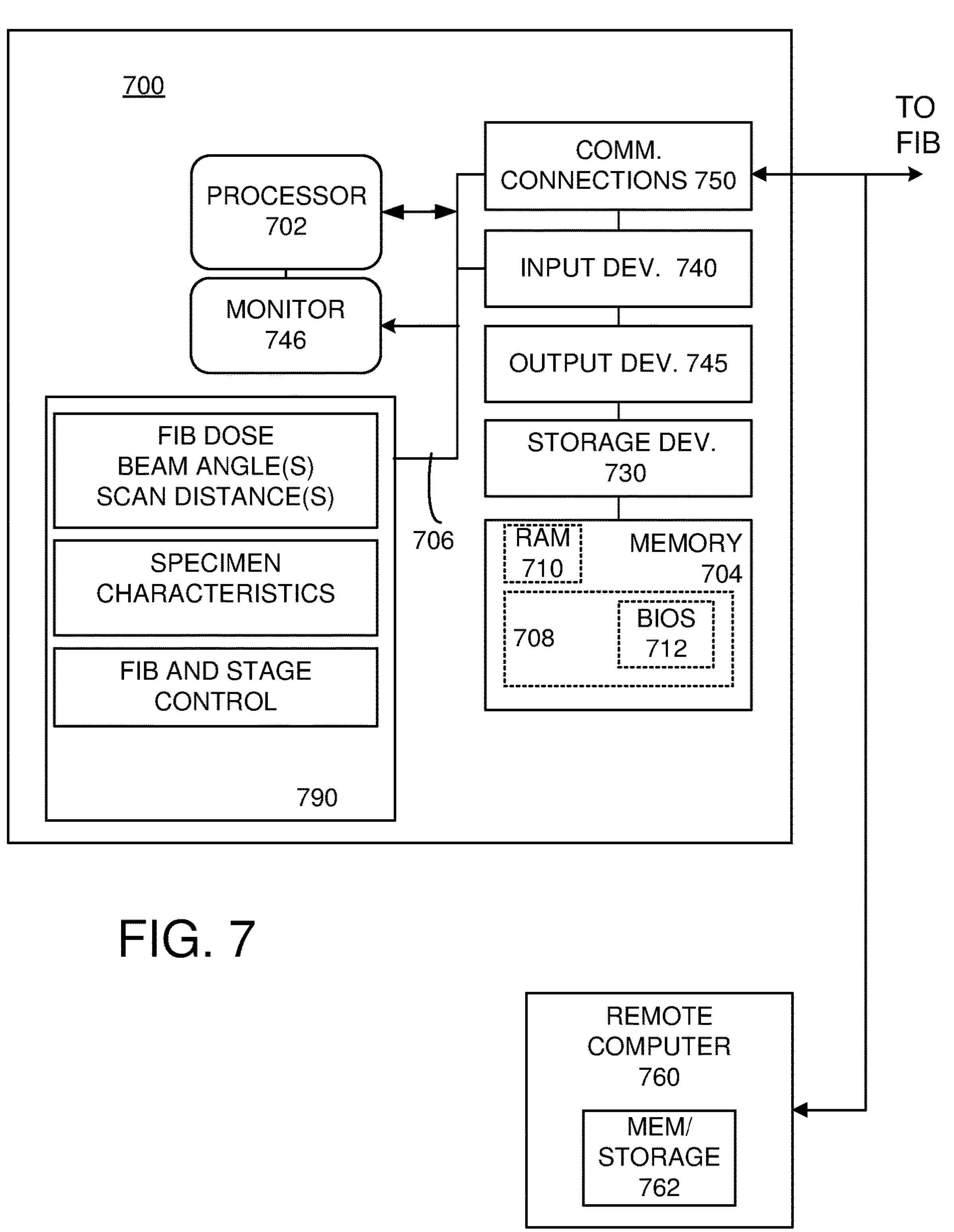
FIG. 7 illustrates a representative computing environment for control of lamella milling.

FIG. 7 and the following discussion are intended to provide a brief, general description of an exemplary computing environment in which the disclosed technology may be implemented. In particular, some or all portions of this computing environment can be used with the above methods and apparatus to, for example, control beam scanning and image processing to identify and align section images, preview images, and image storage. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including handheld devices, tablets, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. In some cases, such processing is provided in an SEM. The disclosed systems can serve to control image acquisition and provide a user interface as well as serve as an image processor.

With reference to FIG. 7, an exemplary system for implementing the disclosed technology includes a general-purpose computing device in the form of an exemplary conventional PC 700, including one or more processing units 702, a system memory 704, and a system bus 706 that couples various system components including the system memory 704 to the one or more processing units 702. The system bus 706 may be any of several types of bus structures including a memory bus or memory controller, a peripheral bus, and a local bus using any of a variety of bus architectures. The exemplary system memory 704 includes read only memory (ROM) 708 and random-access memory (RAM) 710. A basic input/output system (BIOS) 712, containing the basic routines that help with the transfer of information between elements within the PC 700, is stored in ROM 708.

The exemplary PC 700 further includes one or more storage devices 750 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 706 by a hard disk drive interface, a magnetic disk drive interface, and an optical drive interface, respectively. The drives and their associated computer readable media provide nonvolatile storage of computer-readable instructions, data structures, program modules, and other data for the PC 700. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 750 including an operating system, one or more application programs, other program modules, and program data. A user may enter commands and information into the PC 700 through one or more input devices 740 such as a keyboard and a pointing device such as a mouse. For example, the user may enter commands to initiate image acquisition or select whether, for example, optical flow or image differences are to be used to locate charging regions. Other input devices may include a digital camera, microphone, joystick, game pad, satellite dish, scanner, or the like. These and other input devices are often connected to the one or more processing units 702 through a serial port interface that is coupled to the system bus 706 but may be connected by other interfaces such as a parallel port, game port, universal serial bus (USB), or wired or wireless network connection. A monitor 746 or other type of display device is also connected to the system bus 706 via an interface, such as a video adapter, and can display, for example, one or more section images (i.e., images used in identifying and locating sections), preview images, ROI images or other raw or processed images such as images after alignment or with displayed values of translations and rotations needed for alignment. The monitor 746 can also be used to select sections for processing or particular image alignment and alignment procedures such as correlation, feature identification, and preview area selection or other image selection. Other peripheral output devices, such as speakers and printers (not shown), may be included.

The PC 700 may operate in a networked environment using logical connections to one or more remote computers, such as a remote computer 760. In some examples, one or more network or communication connections 750 are included. The remote computer 760 may be another PC, a server, a router, a network PC, or a peer device or other common network node, and typically includes many or all of the elements described above relative to the PC 700, although only a memory storage device 762 has been illustrated in FIG. 7. The personal computer 700 and/or the remote computer 760 can be connected to a logical a local area network (LAN) and a wide area network (WAN). Such networking environments are commonplace in offices, enterprise-wide computer networks, intranets, and the Internet. In some examples, a stack of aligned image is transmitted to a remote system for 5D image reconstruction or other processing.

As shown in FIG. 7, a memory 790 (or portions of this or other memory) store processor executable instructions that establish FIB dose, angles of incidence, scan distances and scan times time, retrieve specimen characteristics for use in determining FIB dose and scan properties, and FIB and stage control. The PC 700 communicates with a FIB system or can be integrated into such a system.

ADDITIONAL EXAMPLES

Example 1 is a method of preparing a lamella, including: directing an ion beam to a back surface of a specimen at a first angle and at a first dose to form a first cut face having an S-shape; and directing the ion beam to the back surface of the specimen at a second angle and at a second dose to form a second cut face having a second S-shape, wherein the first dose and the second dose are selected to produce a lamella having a waist.

Example 2 include the subject matter of claim 1, and further specifies that the waist is situated proximate a front surface or a back surface of the specimen.

Example 3 includes the subject matter of any of Examples 1-2, and further specifies that the first angle is opposite the second angle.

Example 4 includes the subject matter of any of Examples 1-3, and further specifies that the first S-shape is an opposite the second S-shape with respect to an axis perpendicular to the back surface or a front surface of the specimen.

Example 5 includes the subject matter of any of Examples 1-4, and further specifies that the ion beam is scanned along the back surface of the specimen to form the first cut face and the second cut face.

Example 6 includes the subject matter of any of Examples 1-5, and further specifies that the ion beam is scanned to thin the waist.

Example 7 includes the subject matter of any of Examples 1-6, and further specifies that the first angle and second angle have magnitudes of less than 10 degrees, Example 7.5 degrees, 6 degrees, 5 degrees, 5, degrees, Example 2.5 degrees, 2 degrees, or 1 degree with respect to an axis perpendicular to the back surface and the first angle is opposite the second angle.

Example 8 includes the subject matter of any of Examples 1-7, and further specifies that the specimen includes a silicon substrate.

Example 9 includes the subject matter of any of Examples 1-8, and further specifies that the specimen includes a silicon substrate, a device layer, and a coating layer at a front surface opposite the back surface, and the waist is situated within the device layer.

Example 10 includes the subject matter of any of Examples 1-9, and further specifies that the device layer has a thickness between 200 nm and 800 nm, the coating layer has a thickness between 200 nm and 800 nm, the waist dimension is between 10 nm and 40 nm, and the waist is situated between 200 nm and 800 nm from the front surface.

Example 11 includes the subject matter of any of Examples 1-10, comprising rotating the specimen to a first rotation angle and second rotation angle so that the ion beam is directed to the back surface of the specimen at the first angle and the second angle, respectively.

Example 12 includes the subject matter of any of Examples 1-11, and further includes: directing the ion beam to the back surface of a specimen at the first angle and the second angle at a first beam energy followed by a second beam energy that is lower than the first beam energy; and exposing the lamella to the ion beam to thin the lamella.

Example 13 is a lamella, including: a specimen section defined by tapered cut faces that extend from a surface corresponding to a specimen back surface to a waist and from a specimen surface corresponding to a specimen front surface to the waist.

Example 14 includes the subject matter of Example 13, and further specifies that the waist is situated proximate the front surface.

Example 15 includes the subject matter of any of Examples 13-14, and further specifies that the tapered cut faces are S-curved cut faces have oppositely curved S-shapes.

Example 16 includes the subject matter of any of Examples 13-15, and further specifies that the specimen section at the front surface includes a portion of a coating layer.

Example 17 includes the subject matter of any of Examples 13-16, and further specifies that the coating layer is a metallic layer.

Example 18 includes the subject matter of any of Examples 13-17, and further specifies that the specimen section associated with the waist includes a portion of a device layer.

Example 19 includes the subject matter of any of Examples 13-18, and further specifies that the lamella has a height of between 2 μm and 10 μm, 5 μm and 10 μm, or 6 μm to 9 μm, a waist thickness is less than 10 nm, 20 nm, 50 nm, 40 nm, 50 nm, or 100 nm, and a distance from the specimen surface corresponding to the front surface of the specimen section to the waist is greater than 100 nm, 200 nm, 500 nm, 400 nm, or 500 nm.

Example 20 includes the subject matter of any of Examples 13-19, and further specifies that a depth of the specimen section is between 1 μm and 10 μm.

Example 21 is a charged particle beam system, comprising: a focused ion beam (FIB) source; a substrate stage operable to secure a specimen and to orient the specimen with respect to the FIB to select an angle of incidence of the FIB to the specimen; and a control system coupled to the FIB source and the substrate stage to scan the FIB and a specimen surface with respect to each other to define tapered cut faces that extend from a front surface to a back surface of a specimen and define a waist proximate the front surface.

Example 22 includes the subject matter of Example 21, and further specifies that the control system is configured to produce a waist of thickness between 10 nm and 40 nm based on FIB dose and a scan rate of the FIB and the specimen with respect to each other.

Example 23 includes the subject matter of any of Examples 21-22, and further specifies that the tapered cut faces are opposing S-curves.

Example 24 includes the subject matter of any of Examples 21-23, and further specifies that the control system is configured to scan the FIB and the specimen with respect to each other at two opposing angles to define respective tapered cut faces.

Example 25 includes the subject matter of any of Examples 21-24, and further specifies that the control system is configured to scan the FIB and the specimen with respect to each other at the two opposing angles and at a least two beam voltages.

In view of the many possible embodiments to which the principles of the disclosed technology may be applied, it should be recognized that the illustrated embodiments are only preferred examples and should not be taken as limiting the scope of the disclosure.

We claim:

1. A method of preparing a lamella, comprising:

directing an ion beam to a back surface of a specimen at a first angle and at a first dose to form a first cut face having an S-shape; and directing the ion beam to the back surf ace of the specimen at a second angle and at a second dose to form a second cut face having a second S-shape, wherein the first dose and the second dose are selected to produce a lamella having a waist.

2. The method of claim 1, wherein the waist is situated proximate a front surface or a back surface of the specimen.

3. The method of claim 1, wherein the first angle is opposite the second angle.

4. The method of claim 1, wherein the first S-shape is an opposite the second S-shape with respect to an axis perpendicular to the back surface or a front surface of the specimen.

5. The method of claim 1, wherein the ion beam is scanned along the back surface of the specimen to form the first cut face and the second cut face and to thin the waist.

6. The method of claim 1, wherein the first angle and second angle have magnitudes of less than 10 degrees, 7.5 degrees, 6 degrees, 5 degrees, 5, degrees, 2.5 degrees, 2 degrees, or 1 degree with respect to an axis perpendicular to the back surface and the first angle is opposite the second angle.

7. The method of claim 1, wherein the specimen includes a silicon substrate, a device layer, and a coating layer at a front surface opposite the back surface, and the waist is situated within the device layer.

8. The method of claim 7, wherein the device layer has a thickness between 200 nm and 800 nm, the coating layer has a thickness between 200 nm and 800 nm, the waist dimension is between 10 nm and 40 nm, and the waist is situated between 200 nm and 800 nm from the front surface.

9. The method of claim 1, comprising rotating the specimen to a first rotation angle and second rotation angle so that the ion beam is directed to the back surface of the specimen at the first angle and the second angle, respectively.

10. The method of claim 1, further comprising:

directing the ion beam to the back surface of a specimen at the first angle and the second angle at a first beam energy followed by a second beam energy that is lower than the first beam energy; and exposing the lamella to the ion beam to thin the lamella.

11. A lamella, comprising:

a specimen section defined by tapered cut faces that extend from a surface corresponding to a specimen back surface to a waist and from a specimen surface corresponding to a specimen front surface to the waist, wherein the tapered cut faces are S-curved cut faces have oppositely curved S-shapes.

12. The lamella of claim 11, wherein the waist is situated proximate the front surface.

13. The lamella of claim 11, wherein the specimen section at the front surface includes a portion of a metallic coating layer.

14. The lamella of claim 13, wherein the specimen section associated with the waist includes a portion of a device layer.

15. The lamella of claim 13, wherein the lamella has a height of between 2 μm and 10 μm, 5 μm and 10 μm, or 6 μm to 9 μm, a waist thickness is less than 10 nm, 20 nm, 50 nm, 40 nm, 50 nm, or 100 nm, a distance from the specimen surface corresponding to the front surface of the specimen section to the waist is greater than 100 nm, 200 nm, 500 nm, 400 nm, or 500 nm, and a depth of the specimen section is between 1 μm and 10 μm.

16. A lamella, comprising:

a specimen section defined by tapered cut faces that extend from a surface corresponding to a specimen back surface to a waist and from a specimen surface corresponding to a specimen front surface to the waist, wherein the lamella has a height of between 2 μm and 10 μm, 5 μm and 10 μm, or 6 μm to 9 μm, a waist thickness is less than 10 nm, 20 nm, 50 nm, 40 nm, 50 nm, or 100 nm, a distance from the specimen surface corresponding to the front surface of the specimen section to the waist is greater than 100 nm, 200 nm, 500 nm, 400 nm, or 500 nm, and a depth of the specimen section is between 1 μm and 10 μm.

17. The lamella of claim 16, wherein the waist is situated proximate the front surface.

18. The lamella of claim 16, wherein the specimen section at the front surface includes a portion of a metallic coating layer.

19. The lamella of claim 16, wherein the specimen section associated with the waist includes a portion of a device layer.

* * * * *